United States Patent [19]
Shone

[11] Patent Number: 6,004,848
[45] Date of Patent: *Dec. 21, 1999

[54] METHOD OF FORMING A MULTI-LEVEL MEMORY ARRAY WITH CHANNEL BIAS ALGORITHM

[75] Inventor: Fuchia Shone, Hsinchu, Taiwan

[73] Assignee: Macronix International Co., Ltd., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/927,365

[22] Filed: Sep. 9, 1997

[51] Int. Cl.⁶ .............................................. H01L 21/8236
[52] U.S. Cl. ............................................ 438/278; 438/275
[58] Field of Search .................................. 438/130, 275, 438/276, 277, 278, 290, 291, 529

[56] References Cited

U.S. PATENT DOCUMENTS

| | | | |
|---|---|---|---|
| 4,667,217 | 5/1987 | Janning | 357/54 |
| 5,163,021 | 11/1992 | Mehrotra et al. | 365/185 |
| 5,257,224 | 10/1993 | Nojiri et al. | 365/175 |
| 5,278,078 | 1/1994 | Kanebako et al. | 438/278 |
| 5,311,463 | 5/1994 | Taji | 365/51 |
| 5,358,887 | 10/1994 | Hong | 437/48 |
| 5,403,764 | 4/1995 | Yamamoto et al. | 437/48 |
| 5,504,030 | 4/1996 | Chung et al. | 437/52 |
| 5,545,580 | 8/1996 | Sheng et al. | 438/278 |
| 5,556,800 | 9/1996 | Takizawa et al. | 437/45 |
| 5,576,573 | 11/1996 | Su et al. | 257/391 |
| 5,585,297 | 12/1996 | Sheng et al. | 438/278 |
| 5,891,781 | 4/1999 | Choi | 438/278 |

OTHER PUBLICATIONS

Kenichi, K., Patent Abstracts of Japan, vol. 010, No. 074, Mar. 25, 1986, for JP60211699 published Oct. 24, 1985.

Yoshimitsu, Y., Patent Abstracts of Japan, vol. 014, No. 371, Aug. 10, 1990, for JP02133967 published May 23, 1990.

*Primary Examiner*—Charles Bowers
*Assistant Examiner*—Jack Chen
*Attorney, Agent, or Firm*—Haynes & Beffel LLP

[57] ABSTRACT

A technique for storing multiple bits per cell in a read only memory device, provides for two kinds of code implants in the memory array. A shallow implant such as used in prior art mask ROMs is used for coding a first bit, and a deeper implant is used for coding a second bit in the memory cells. Furthermore, the cells are implemented in a semiconductor substrate so that the channels of the transistors in the mask ROM can be biased. The memory cells include as isolation layer formed in the semiconductor substrate, and a channel well formed in the isolation layer. The device includes resources to apply a first bias potential such as ground, to channel regions of memory cells in the array. When the first bias potential is applied through the channel regions, the memory cells have particular thresholds determined at least in part by the dope concentrations in the channel regions. The device also includes resources to apply a second bias potential to the channel regions of the memory cells. When the second bias potential is applied, a shift in the threshold voltages in the memory cells is induced. The shift in threshold voltage occurs because of the so called body effect, and will be greater in the memory cells which have the deep implants, than in the memory cells which do not have the deep implants. The device also includes wordlines and bitlines by which to read the data stored in the array.

4 Claims, 7 Drawing Sheets

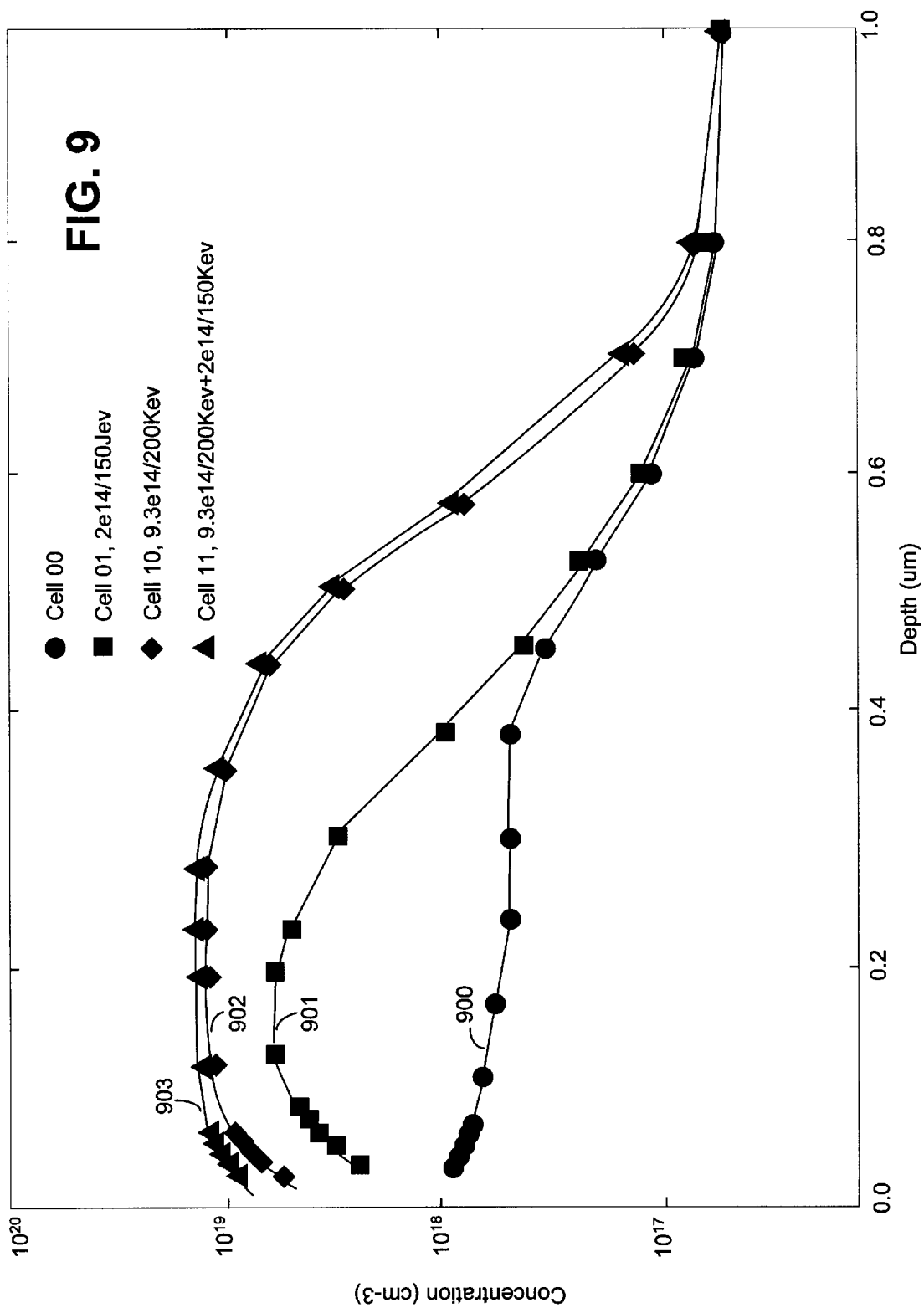

METHOD OF FORMING A MULTI-LEVEL MEMORY ARRAY WITH CHANNEL BIAS ALGORITHM

BACKGROUND OF THE INVENTION

1. Field of the Invention

The present invention relates to integrated circuit memories, and more particularly to multiple bit per cell read only memory devices.

2. Description of Related Art

The cost of integrated circuit memory devices is closely related to the amount of area on an integrated circuit that is required to store a given amount of data, a parameter often referred to as the density of the device. By saving area on an integrated circuit, a manufacturer is able to make more chips with a given wafer in the fabrication factory. More chips per wafer translates directly to cost savings which can then be passed on to the consumers of the memory devices.

One avenue for increasing the density of memory devices involves storing more than one bit per memory cell. Thus for example, the ability to store two bits per cell allows twice times the data density on an integrated circuit.

Multiple bit per cell technologies have been developed for floating gate memory devices. See U.S. Pat. No. 5,163,021 to Mehrotra, et al. However, the floating gate memory approach involves complex charging and discharging of the floating gates, and difficult sensing technology, which increases the complexity and reduces the reliability of the devices.

Another technique for increasing the density of memory devices involves multiple layers of memory cells in a given area on the device. This is typically implemented using thin film techniques in which transistors are stacked on top of one another, creating more than one memory cell per unit area. Typical prior art in this area includes U.S. Pat. No. 5,358,887 invented by Hong. The multi-layer approach reviews special manufacturing steps, and special decoding circuitry which increase cost and reduce reliability.

Accordingly, there is a need for a simpler, low cost technique for implementing multiple bits per cell in a memory device.

SUMMARY OF THE INVENTION

The present invention provides a technique for storing multiple bits per cell in a read only memory ROM device. For example, in a typical mask ROM, the present invention provides for two kinds of code implants in the memory array. A typical shallow implant such as used in prior art mask ROMs is used for coding a first bit, and a deeper implant is used for coding a second bit in the memory cells. The cells are implemented in a semiconductor substrate arranged so that the channel regions, in which channels of the transistors in the mask ROM are formed, can be biased in at least two levels. In a first channel bias condition, the deep implant has only a small effect on the cell threshold. In a second channel bias condition, the deep implant has a substantial effect due to a shift in thresholds, called the body effect, induced by the channel bias.

Thus, an array of memory cells is provided comprising transistors having channels in channel regions, and having threshold voltages dependent upon a dope concentration in the channel regions. A first set of cells in the array have a base dope concentration in the channel regions. A second set of memory cells in the array have first implants which increase, or otherwise change the dope concentrations in the channel regions. A third set of memory cells in the array have second implants which are deeper than the first implants which also increase, or otherwise change, the dope concentrations in the channel regions. A fourth set of memory cells in the array has a combination of the first and second implants in their channel regions. The integrated circuit memory includes resources to apply a first bias potential such as ground, to channel regions of memory cells in the array. When the first bias potential is applied to the channel regions, the memory cells have particular thresholds determined at least in part by the dope concentrations in the channel regions. The device also includes resources to apply a second bias potential to the channel regions of the memory cells. When the second bias potential is applied, a shift in the threshold voltages in the memory cells is induced. The shift in threshold voltage occurs because of the so called body effect, and will be greater in the third and fourth sets of memory cells which have the deep implants, than in the first and second sets of memory cells which do not have the deep implants. The device also includes wordlines and bitlines by which to read the data stored in the array.

According to one implementation of the invention, resources for reading the data from the array include a state machine or other logic that applies a read potential to a selected wordline to determine whether a selected memory cell is a member of the second or fourth sets of memory cells (having shallow implants) or a member of the first or third sets of memory cells (not having shallow implants). Thus the first read potential falls at a value between the threshold of the cells that have the first implant with or without the second implant and cells that do not have the first implant with or without the second implant. If the selected cell is a member of the first or third sets, then the second bias potential is applied to the channel regions and a second read potential is applied to the selected wordline. The second bias potential induces a larger shift in threshold in the third set of cells because of the deep implant than it induces in the first set of cells which has the base dope concentration without implant. The second read potential is thus selected as a value between the threshold voltages of the first and third sets of cells to determine the value of the data stored. If after the application of the first read potential under the condition of the first bias potential in the channel region, the selected cell is determined to be within the second or fourth sets of cells, then the second bias potential is applied to the channel regions and a third read potential is applied to the selected wordline. Because the second bias potential induces a shift in threshold that is greater in the fourth set of cells than in the second set of cells, due to the deep implants found in the fourth set of cells, the circuitry is able to discriminate between cells in the second set and cells in the fourth set by a wordline potential which is between these threshold values. Thus the third read potential is the value that falls between the threshold potential of the cells in the second and fourth sets after application of the second bias potential.

According to an alternative approach, the resources for reading the data operate by applying the first bias potential to the channel regions and a first read potential to a selected wordline by which to determine whether a selected memory cell is a member of the fourth set of cells, and then if the selected memory cell is not a member of the fourth set of cells, then applying the second bias potential to the channel regions and a second read potential to determine whether the memory cell is a member of the second set of cells. If the selected cell is not a member of the second or fourth sets of cells, then applying the second bias potential to the channel regions and a third read potential to determine whether the memory cell is a member of the third set or a member of the first set. According to this approach, the first read potential has a value between the threshold of the fourth set of cells in the threshold of the second set of cells under conditions of a bias channel region. The second read potential has a value between the threshold of the second set of cells and the threshold of the third set of cells. The third read potential has a value between the third set of cells and the first set of cells.

According to one aspect of the invention, the memory cells comprise n-channel field effect transistors such as found in typical mask ROM devices. Under this condition, the second bias potential is negative and the first bias potential is ground, for example. Typically, whether the memory cells comprise n-channel or p-channel devices, the second bias potential according to the present invention has an absolute value greater than the first bias potential so as to induce a greater shift in threshold values of the cells having the deep implants than the cells having only shallow implants or no implants.

According to another aspect of the present invention, all of the cells in the array include a base implant to establish a base dope concentration and a base threshold value for the array. This base implant is used typically to ensure that the turn on voltage for the memory cells is slightly above ground. The first shallow code implant and second deep code implant further adjust the concentration profile in the channel regions of the cells according to the present invention for the purposes of storing multiple bits per cell.

The present invention can also be characterized as a method for encoding data in a mask ROM array. The method according to the present invention includes applying a first implant mask exposing code implant regions in a first set of cells in the array and implanting dopants at a first depth in the first set of cells. Next, the method includes applying a second implant mask exposing code implant regions in a second set of cells in the array, and implanting dopants at a second depth in the second set. Of course, the first sets and the second sets normally overlap, creating a mask ROM array storing multiple bits per cell.

According to one aspect of the invention, the mask ROM array comprises n-channel ROM cells, and the step of implanting dopants at a first depth includes implanting boron with an ion implantation process at an energy and a range of 100 to 200 keV (Thousands of electron volts), and the step of implanting dopants at a second depth includes implanting boron with an ion implantation process at an energy and a range of 175 to 500 keV. Preferably, the first implant of boron is executed with an implantation process at an energy in a range of 150 to 185 keV, and the second implant includes implanting boron with an implantation process at an energy and range of 200 to 500 keV.

Accordingly, the present invention provides a multi-level non-volatile memory cell and a technique for reading the memory cells which are suitable for high density mask ROM type memory devices. The technique can also be utilized for cell threshold adjustment in a variety of other settings.

Other aspects and advantages of the present invention can be seen upon review of the figures, the detailed description, and the claims which follow.

BRIEF DESCRIPTION OF THE FIGURES

FIG. 9 is a graph illustrating the vertical doping profile for one example multi-level mask ROM according to the present invention.

DETAILED DESCRIPTION

A detailed description of preferred embodiments of the present invention is provided with respect to FIGS. 1–9. A cell structure for implementing multiple bits per cell in a mask ROM device is described with reference to FIGS. 1 and 2. A manufacturing process, an architecture of an integrated circuit, and reading techniques are described with respect to FIGS. 3–9.

Figure 1:
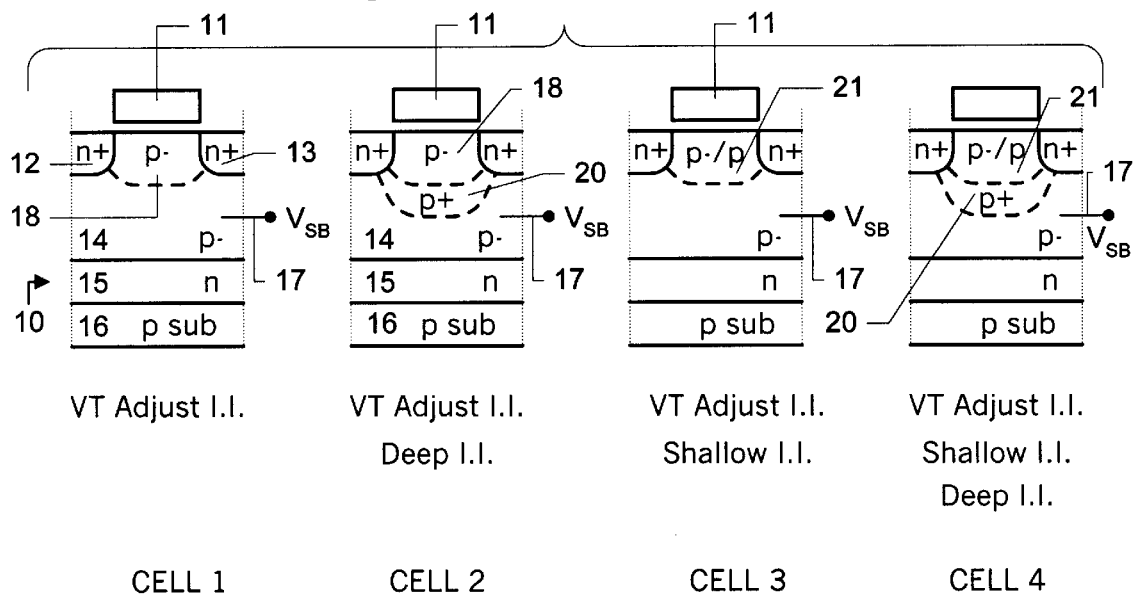
FIG. 1 illustrates the mask ROM cell according to the present invention in each of the four coding states according to the present invention.

FIG. 1 shows four ROM cells having the four implant states according to the present invention. Thus, cell 1 is a n-channel transistor formed in a semiconductor substrate 10. The n-channel transistor includes a gate 11, such as formed by a wordline in a ROM array, a drain 12 formed by a n-type implant in the substrate 10, and a source 13 formed by a n-type implant in the substrate 10. The n-channel cell according to the present invention is formed in a channel well 14. The channel well 14 itself is implemented inside an isolation well 15. The isolation well 15 is formed in a p-type semiconductor substrate 16. The channel well 14 is coupled to a substrate bias terminal 17 by which a substrate bias potential is applied to the channel regions of the n-channel transistor. In a preferred embodiment, the channel region is formed with a p implant referred to as a $V_T$ adjustment implant used to raise the threshold voltage of the n-channel transistor relative to that of a cell not having the implant. This base implant may or may not be necessary depending on the concentration of the channel well 14. Thus, cell 1 in FIG. 1 corresponds to a ROM cell having only the $V_T$ adjust implant 18, and no code implants.

Cell 2 in FIG. 1 illustrates a deep code implant according to the present invention. The elements of cell 2 which correspond to the same elements in cell 1 have like reference numbers. Thus, cell 2 includes the $V_T$ adjust implant, represented by the region 18, and a deep implant represented by the region 20. The $V_T$ plus implant will have a concentration of dopants greater than the $V_T$ adjust implant in region 18, and be implanted with a higher energy such that its depth is greater than the $V_T$ adjust implant.

Cell 3 in FIG. 1 illustrates a ROM cell with only a shallow code implant. Thus, region 21 in cell 3 corresponds to a shallow code implant in combination with the $V_T$ adjust implant.

Cell 4 corresponds to the fourth cell structure in the mask ROM according to the present invention. In the fourth cell structure, a combination of the shallow and deep code implants is utilized. Thus, a code implant 21 in the shallow portions of the channel region includes a combination of the $V_T$ adjust implant and the shallow implant. A code implant 20 which is deeper than the shallow code implant 21 is also included in cell 4.

In cells 1–4, the threshold voltage $V_T$, that is the voltage between the gate 11 and the source 13 at which current is conducted in the transistor, is determined predominantly by the dope concentrations in the channel of the cell. However, it is also determined by the substrate bias potential 17 applied to the channel well 14.

Figure 2:
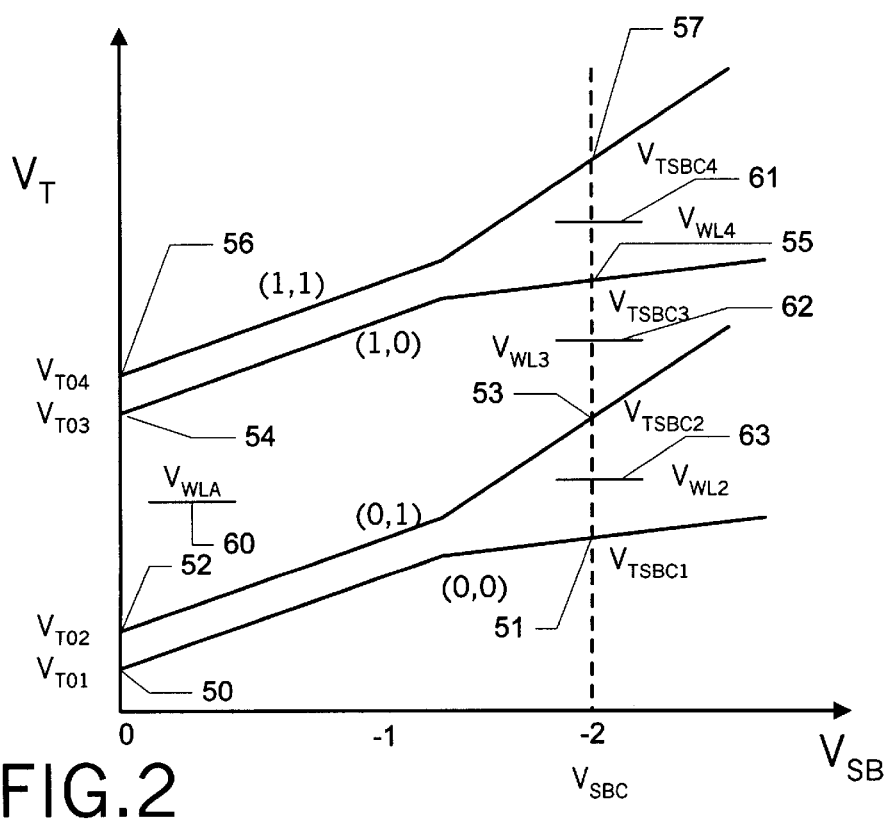
FIG. 2 is a graph illustrating the threshold voltage shift induced by increasing substrate bias.

FIG. 2 is a simplified graph showing the relationship of threshold voltage $V_T$ to substrate bias voltage $V_{SB}$. For cell 1, a threshold voltage $V_{T01}$ at point 50 is determined predominately by the $V_T$ adjust implant. As the substrate bias potential $V_{SB}$ increases, the threshold of cell 1 increases as well. At a critical substrate bias potential $V_{SBC}$, the threshold of cell 1 is seen at point 51.

For cell 2, the threshold voltage $V_{T02}$ is found at point 52, and at the substrate bias $V_{SBC}$, threshold voltage is found at point 53. As can be seen, the shift in threshold voltage induced by the increasing substrate bias potential is greater in cell 2 than it is in cell 1 due to the deep implant 20.

Cell 3 has an initial threshold voltage at point 54 which increases with the substrate bias potential to point 55 at the critical substrate bias potential $V_{SBC}$. Cell 4 has an initial threshold voltage at point 56 slightly higher than that of cell 3, and increases with substrate bias potential to point 57. As can be seen, the threshold voltage of cell 4 shifts to a greater degree in response to the substrate bias potential than does the threshold voltage of cell 3.

Accordingly, as can be seen in FIG. 2 a reading circuit can discriminate between cells 1 and 2 and cells 3 and 4 by a wordline voltage $V_{WLA}$ in the neighborhood of point 60.

After applying the critical substrate bias potential $V_{SBC}$, a reading circuit can discriminate between cell 4 and cell 3 by a wordline potential $V_{WL4}$ at point 61. Likewise after applying the critical substrate bias potential, a reading circuit can discriminate between cell 3 and cell 2 by a wordline potential $V_{WL3}$ at point 62. A reading circuit can discriminate at the critical substrate bias potential between cell 2 and cell 1 using a wordline potential $V_{WL2}$ in the neighborhood of point 63.

The substrate potential $V_{SB}$ in FIG. 2 is negative for a n-channel device such as cells 1–4 in FIG. 1. For a p-channel device, the substrate potential is positive.

In alternative systems, the cell may comprise a depletion mode device prior to code implants, in which the code implants change the doping profile to cause enhancement mode operation.

Figure 3A:
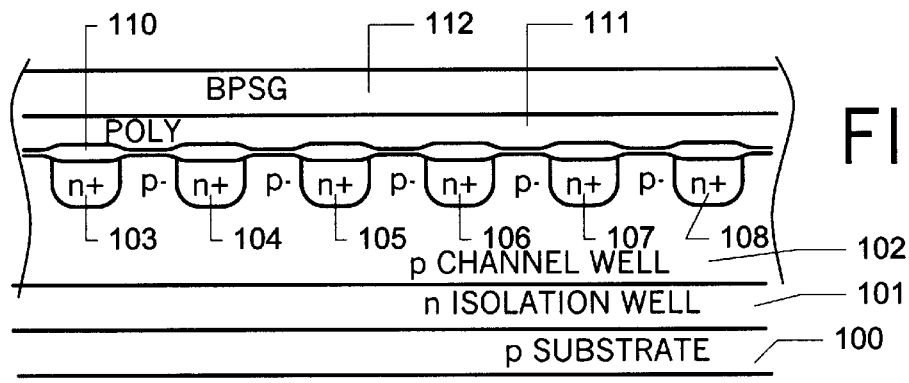
FIG. 3A–3C illustrate the code implant process according to the present invention for a mask ROM device.
Figure 3B:
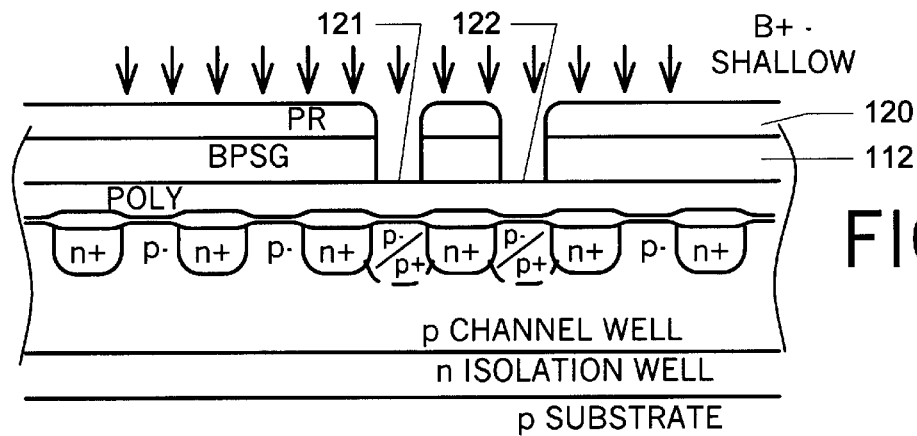

FIGS. 3A–3B illustrate a process for implanting the code implants according to the present invention. FIG. 3A illustrates a typical mask ROM array in cross section prior to code implants. Thus the array is formed on a p-type substrate 100. A n-type isolation well 101 is formed in the substrate 100. A p-type channel well 102 is formed in the isolation well. Buried diffusion bit lines 103–108 are formed in the channel well. Dielectric layer 110 is formed over the semiconductor substrate. The dielectric layer 110 is thinner over the channel regions of the cells between the bit line diffusions than over the diffusions themselves, forming a gate dielectric for the cells. A polysilicon wordline 111 is formed over the dielectric 110 to create a row of ROM cells. A passivation layer 112 such as borophosphosilicate glass BPSG is formed over the wordline.

The deep n-type isolation well 110 is formed in one embodiment as an early step in the integrated circuit manufacturing process, during which the n-type isolation well is patterned, and a phosphorous implant for example $6 \times 10^{12}/\text{cm}^2$ is made at about 120 keV and yield at about 1050° C. for about 12 hours. The p-type channel well 102 is implemented in this embodiment by patterning the p-type well, and executing a $7 \times 10^2/\text{cm}^2$ boron implant at about 100 keV followed by an anneal at about 1050° C. for about 3 hours and 10 minutes. This processing results in a n-type well in selected areas with a depth of about 6 microns, and a p-type well within selected areas of the n-type well with a depth of about 3 microns. The parameters of the process for forming the n-type and p-type wells will vary from embodiment to embodiment, to suit particular design needs. The mask ROM manufacturing steps in FIG. 3A can be done in a variety of technologies as well. See for example U.S. Pat. No. 5,117,389 entitled FLAT CELL READ ONLY MEMORY INTEGRATED CIRCUIT invented by Tom D. H. Yiu, which is incorporated by reference as if fully set forth herein.

Figure 3C:
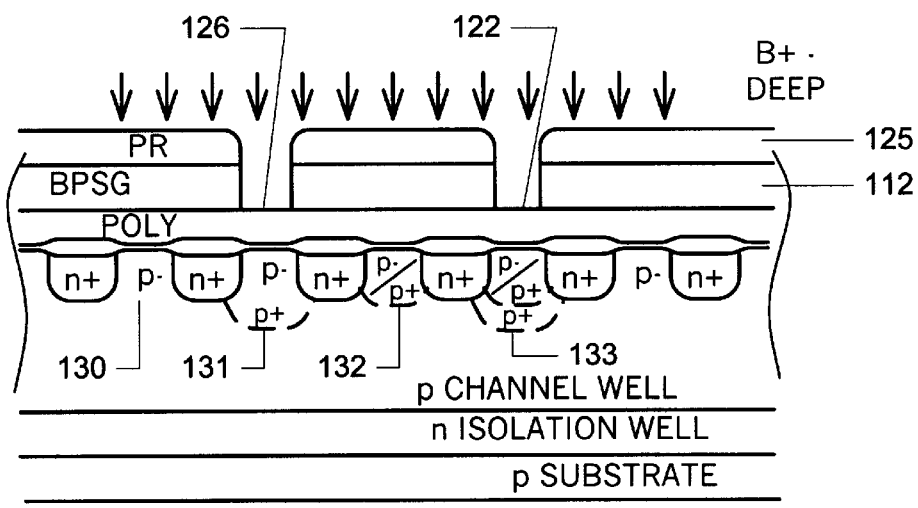

To implement the code implants according to the present invention, a first shallow implant step as illustrated in FIG. 3B is followed by a second deep implant step as illustrated in FIG. 3C.

FIG. 3B illustrates the implementation of a photoresist mask 120 over the passivation layer 112. The photoresist mask is used to expose channel regions 121, 122 of selected cells in the array. A shallow boron implant in this embodiment is implanted with an ion implantation process with an energy in the range of for example 100 to 200 keV, and more preferably in the range of 150 to 185 keV.

After the code implant of step shown in FIG. 3B, a deep implant is executed as shown in FIG. 3C. Thus, the passivation layer 112 is reconstituted, and a photoresist mask 125 is implemented. The photoresist mask 125 is used to expose channel regions 126 and 122 for the deep implant. Note that channel region 122 is the same channel region 122 as was exposed in FIG. 3B to the shallow implant. The deep boron implant is implemented using an ion implantation process at an energy in a range of 175–500 keV, more preferably in a range of 200–500 keV. As can be seen in FIG. 3C, the two code implant steps result in cells storing four different patterns of two bits. For example, cell 130 stores the bit pattern (0,0). Cell 131 stores the bit pattern (0,1). Cell 132 stores the bit pattern (1,0). Cell 133 stores the bit pattern (1,1).

Figure 4:
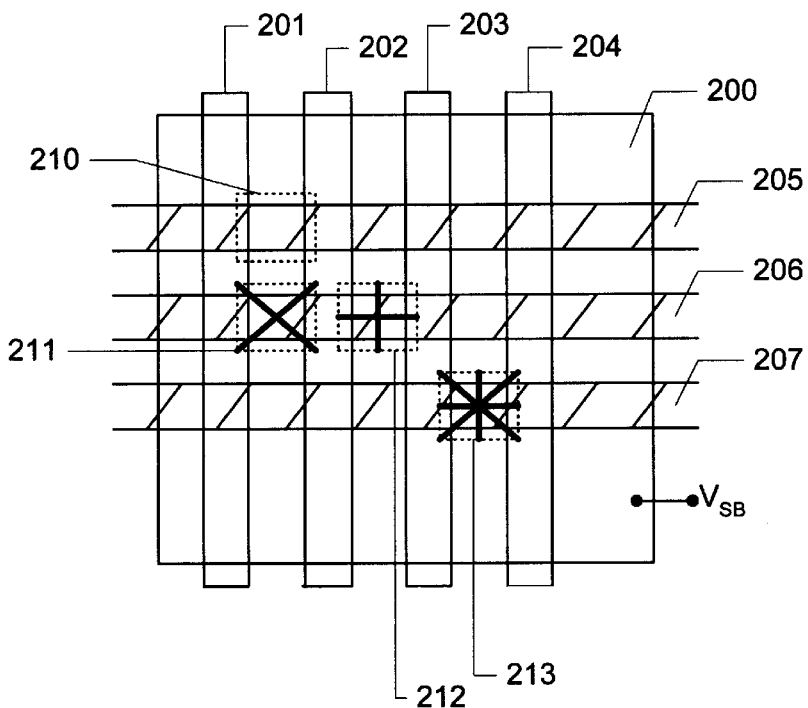
FIG. 4 is a simplified layout diagram of a mask ROM memory array according to the present invention.

FIG. 4 is a simplified diagram of the top view of an array having the two types of code implants according to the present invention. Thus, the array includes a channel well 200 at which a substrate bias potential $V_{SB}$ can be applied to the channel regions of cells in the array. Buried diffusion bitlines 201, 202, 203, 204 are formed within the array. Polysilicon wordlines 205, 206, 207 overlie the bitlines and form memory cell transistors between the bitlines.

In FIG. 4, cell 210 represents a device without the shallow or deep implants. Cell 211 represents the device having only the deep implants. Cell 212 represents the device having only the shallow implants. Cell 213 represents the device having both the deep and shallow implants. The pattern in the array of the respective types of cells determines the data being stored in the array. By storing two bits per array, the density of data stored per unit area is reduced by one half.

Figure 5:
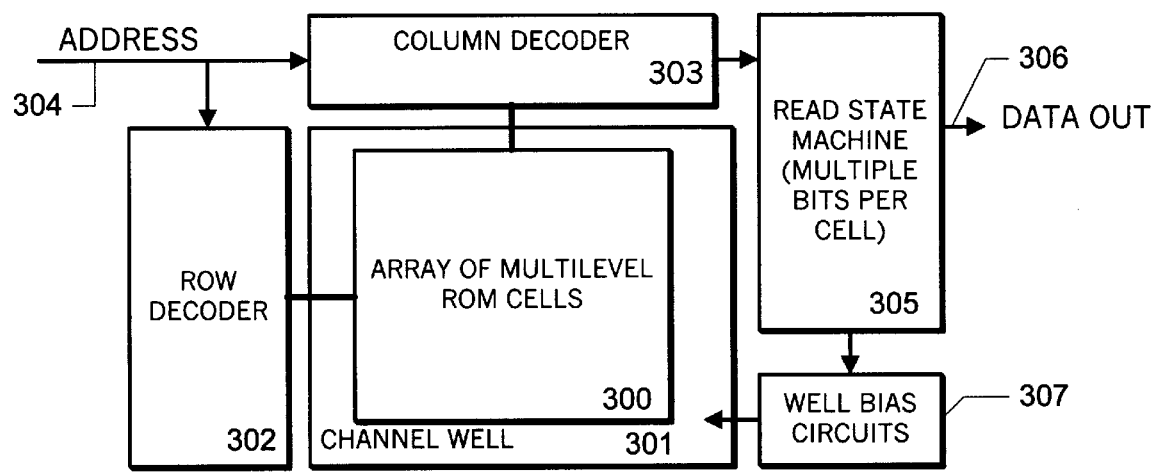
FIG. 5 is a simplified block diagram of an integrated circuit memory including an array of multi-level ROM cells according to the present invention.

FIG. 5 is a simplified diagram of an integrated circuit memory device according to the present invention. The integrated circuit memory includes an array of multi-level ROM cells 300 such as that illustrated with respect to FIG. 4. The array of ROM cells 300 is formed in a channel well 301. A row decoder 302 and a column decoder 303 are coupled with the array 300. An address is supplied on line 304 to the row decoder and column decoder to select a particular cell. The data of the accessed cell is supplied through the column decoder circuitry into a read state machine 305 through which the output data 306 is supplied. The read state machine 305 is coupled to well bias circuits 307 controlling the substrate bias in the channel well 301 as discussed above.

Figure 6:
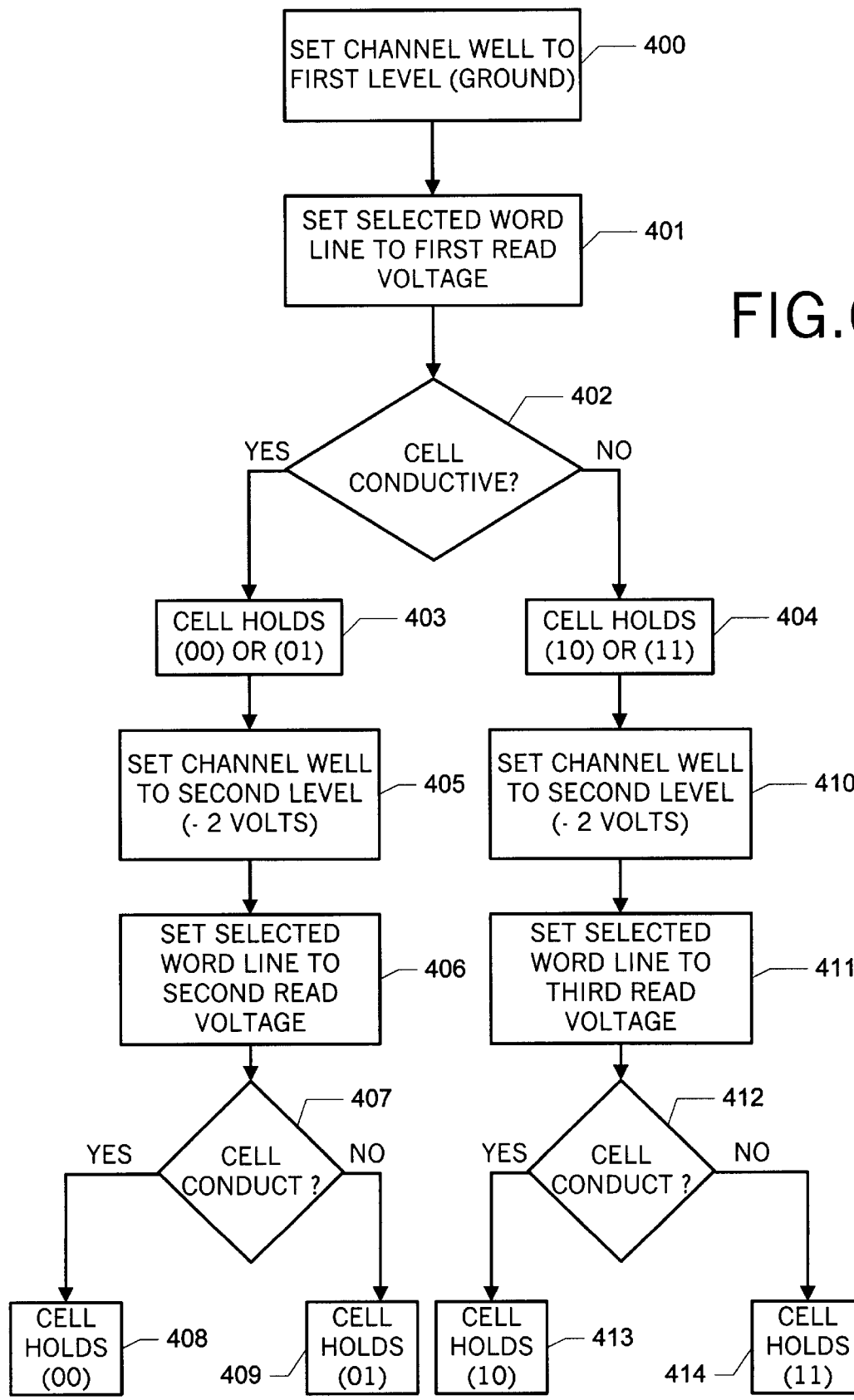
FIG. 6 is a flow chart illustrating the read process according to a first approach for the integrated circuit memory of FIG. 5.
Figure 7:
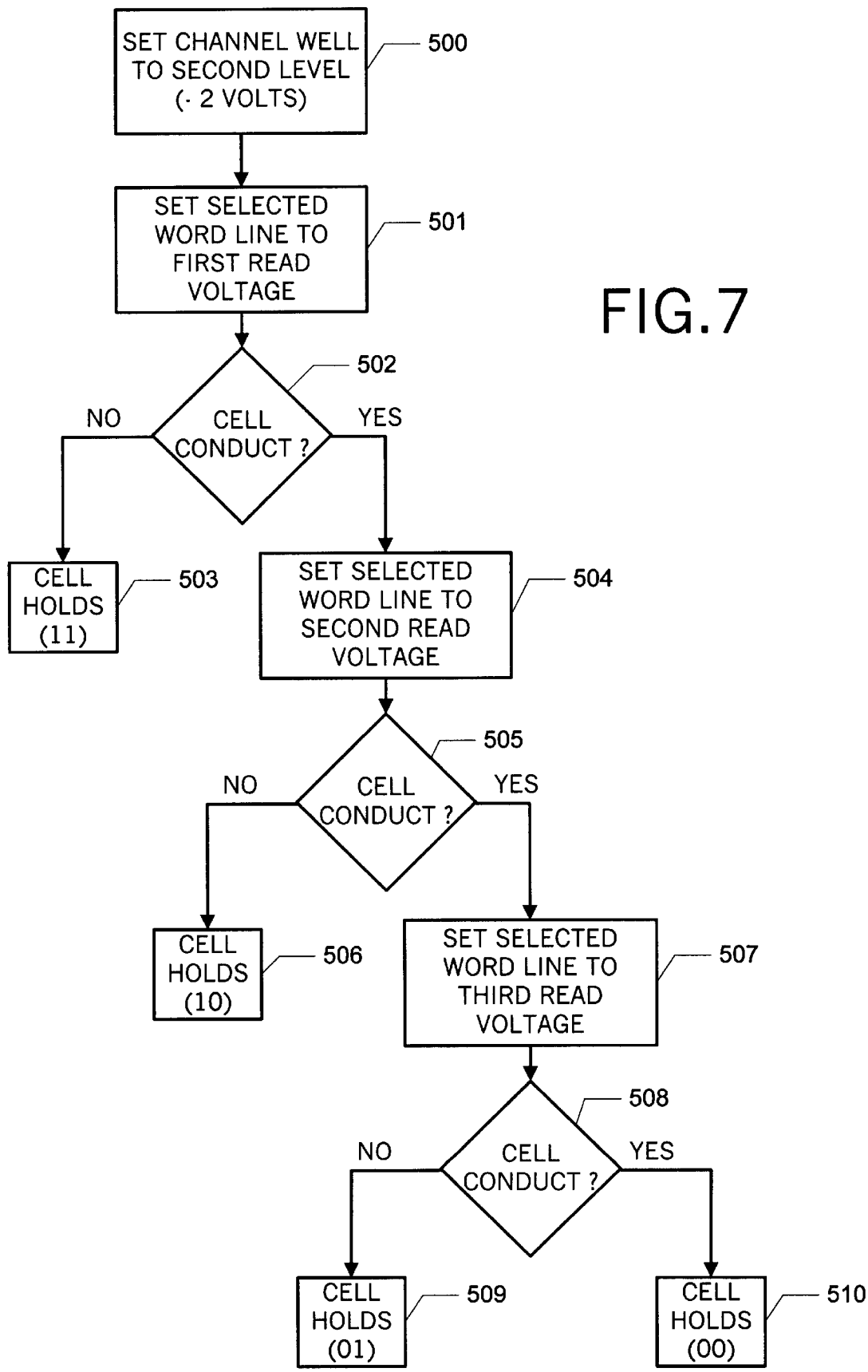
FIG. 7 is a flow chart of the read process for the integrated circuit memory of FIG. 5 according to a second approach.

The operation of the read state machine 305 can be understood with reference to two alternative approaches shown in FIGS. 6 and 7.

According to the technique shown in FIG. 6, the state machine is programmed to execute a process which involves first setting the channel well to a first level, such as ground (step 400). The wordline decoder is used to select a wordline and set it to a first read voltage (step 401). The first read voltage corresponds to the voltage $V_{WLA}$ 60 of FIG. 2. In the next step, the column decoder is executed to determine whether a selected cell is conductive or not (step 402). If the cell is conductive, then it is determined that the first read voltage is higher than the threshold, and the cell holds either the data value (0,0) or the data value (0,1). (step 403). If the cell is not conductive at step 402, then it is determined that the cell holds the data value (1,0) or the data value (1,1)(step 404).

If it is determined that the cell holds (0,0) or (0,1), then the channel well is set to a second level such as minus 2 volts (step 405). Next, the selected wordline is set to a second read voltage (step 406). This second read voltage is set at a potential such as the level $V_{WL2}$ 63 of FIG. 2. Next it is determined whether the selected cell is conductive or not (step 407). If it is conductive, then the second read voltage is greater than the threshold of the cell and the cell holds the data value (0,0) (step 408). If the cell is not conductive at step 407, then the cell holds the data value (0,1)(step 409).

If at step 402 it is determined that the cell holds either (1,0) or (1,1) as indicated in step 404, then the channel well is set to the second level, or otherwise adjusted to induce a threshold shift (step 410). The selected wordline is set to a third read voltage (step 411). The third read voltage corresponds to a voltage at the level $V_{WL4}$ 61 of FIG. 2. Next it is determined whether the cell is conductive (step 412). If the cell is conductive, then the data value in the cell is (1,0)(step 413). If the cell is not conductive at step 412, then the cell holds the data value (1,1)(step 414). Thus, the state machine according to FIG. 6 is programmed to do a binary search technique which requires a two step read for all cells.

An alternative approach is illustrated in FIG. 7, in which the process of reading the multi-level cells begins by setting the channel well to the second level (step 500). For a p-channel ROM device such as illustrated in FIG. 5, the second level is about minus 2 volts for example. Next, the selected wordline is set to a first read voltage (step 501). In this embodiment, the first read voltage corresponds to the voltage $V_{WL4}$ at point 61 in FIG. 2. The process then determines whether the cell is conductive or not (step 502). If the cell is not conductive, then it is determined that the cell holds the data value (1,1)(step 503). If the cell is conductive, then the selected wordline is set to a second read voltage (step 504).

After step 504, it is determined whether the cell is conductive or not (step 505). If it is not conductive, then the cell holds the value (1,0)(step 506).

If the cell is conductive at step 505, then the selected wordline is set to a third read voltage (step 507). The third read voltage corresponds to the level $V_{WL2}$ at point 63 in FIG. 2. Next it is determined whether the cell is conductive at the third read voltage (step 508). If it is not conductive, then it is determined that the cell holds the data value (0,1)(step 509). If the cell is conductive at step 508, then it is determined that the cell holds the value (0,0)(step 510).

Thus, in FIG. 7, a linear search is conducted to determine the data value held in the cell. A disadvantage of the linear search technique is that the amount of time necessary to decode the contents of the cell varies from one to three cycles, dependent on the contents of the cell. This can be advantageous in some settings. However, a more predictable, two step binary search technique at FIG. 6 may be preferable in other circumstances.

Figure 8:
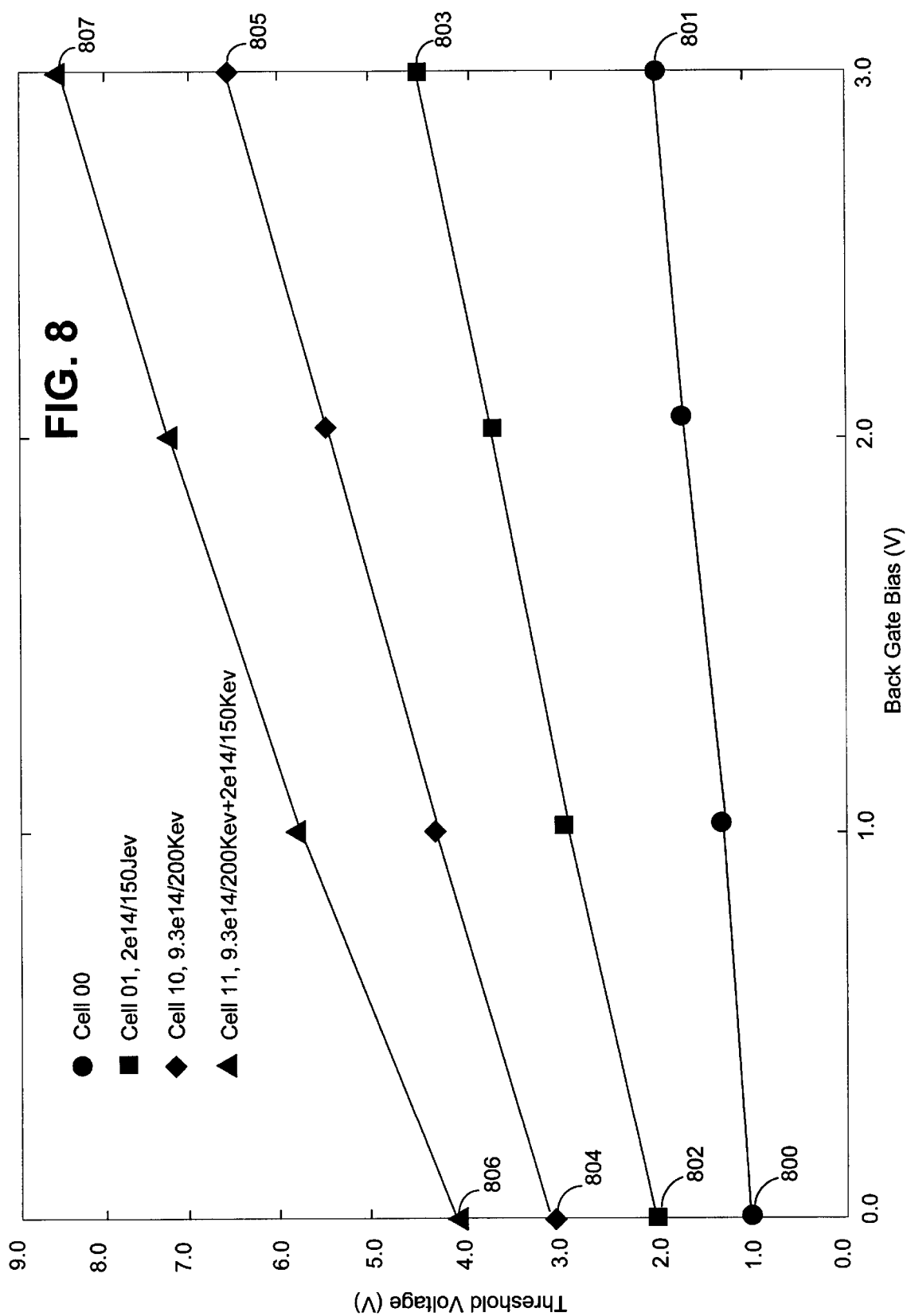
FIG. 8 is a graph illustrating the threshold voltages for multi-level mask ROMs according to one example embodiment of the present invention.

FIGS. 8 and 9 provide example threshold voltage data and vertical doping profile data for a multi-level mask ROM implemented according to the present invention. FIG. 8 illustrates the effect on threshold voltages of the multi-level mask ROM of the present invention. In particular, four cells were implemented. The first cell, cell 00, had no implant, and is the initial low threshold voltage cell. The initial threshold voltage is shown at point 800, and as the back gate bias increases, to 1 volt up to 3 volts by corresponding negative channel bias, the threshold increases to point 801. The second cell, cell 01, has a single shallow implant at $2\times10^{14}$ cm$^{-2}$ concentration with a 150 Kev implant energy of boron ions. The initial threshold for this cell with zero back bias is shown at point 802. With a back bias of 3 volts, the threshold has increased to point 803. The third cell, cell 10, has a single deep implant of $9.3\times10^{14}$ cm$^{-2}$ boron ions with an implant energy of 200 Kev. The initial threshold for cell 10 is shown at point 804. With a back bias of 3 volts, the threshold increases to point 805. The last cell, cell 11, has a combination of the shallow implant and the deep implant. The initial threshold for cell 11 is shown at point 806 on the graph, and the and the threshold with a back bias of 3 volts is shown at point 807. As can be seen in FIG. 8, excellent level-to-level differences are obtained for the four types of cells. The effects of the back gate bias on the four level mask ROM cells are also apparent. By applying a 2 volt back gate bias, the level-to-level difference is amplified from less than 1 volt to about 2 volts per cell. The major reason for this shift in threshold is believed to be the bulk doping profiles of the multi-level mask ROM cells modulated by the implantation.

The doping profiles are shown for this example implantation energy combination in FIG. 9. For cell 00, the vertical doping profile is shown on trace 900. For cell 01, the vertical doping profile is shown on trace 901. For cell 10, the vertical doping profile trace is shown on line 902. For cell 11, the vertical doping profile is shown on line 903. The higher surface doping concentration of cell 11 leads to a higher threshold voltage at 0 back gate bias. Also, the differences in surface doping concentration have a significant impact on the body effect in such cells. Therefore, the back gate bias generates greater level-to-level differences for the four types of cells.

Thus by adjusting the ion implantation dosage and energy, a four level mask ROM cell can be implemented using only two masks. In addition, by applying back gate bias, the noise margin is increased because of the different amount of body effect encountered by each of the four cells.

Although in the embodiments described, the critical substrate bias potential represented as a single value independent of the presence of the shallow implant, in alternative systems, the substrate bias potential can be adjusted for optimum performance in the case of the presence or absence of the shallow implants. Thus, each read cycle involves setting the substrate bias potential to a particular value, along with setting the wordline potential for best results.

Accordingly, a low cost and simple to manufacture multi-level ROM device has been provided taking advantage of the non-linearity of the body effect with doping concentration, particularly in the presence of deep implants.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for encoding multilevel data in a mask ROM array, the method comprising the steps of:

forming an isolation well in a semiconductor substrate;

forming a channel well in the isolation well, the channel well having code implant regions;

applying a first implant mask exposing the code implant regions in a first set of cells in the array, and implanting dopants at a first depth in the first set; and applying a second implant mask exposing the code implant regions in a second set of cells in the array and implanting dopants at a second depth in the second set;

wherein first, second, third, and fourth groups of cells are formed having respective threshold voltages, the first group of cells including cells in the array that are not in the first set nor in the second set; the second group of cells including cells in the array that are only in the first set; the third group of cells including cells in the array that are only in the second set; and the fourth group of cells in the array including cells that are in both the first set and the second set.

2. The method of claim 1, wherein the mask ROM array comprises n-channel ROM cells, and the step of implanting dopants at a first depth includes implanting boron with an ion implantation process at an energy in a range of 100 to 200 keV, and the step of implanting dopants at a second depth includes implanting boron with an ion implantation process at an energy in a range of 175 to 500 keV.

3. The method of claim 1, wherein the step of implanting dopants at a first depth includes implanting boron with an ion implantation process at an energy in a range of 150 to 185 keV, and the step of implanting dopants at a second depth includes implanting boron with an ion implantation process at an energy in a range of 200 to 500 keV.

4. The method of claim 1, wherein additional steps include:

applying a first bias potential to the channel well in the array to produce threshold voltages in the cells;

applying a second bias potential to the channel well in the array to produce a shift in the threshold voltages.

* * * * *